(12) United States Patent  
Minzoni

(10) Patent No.: US 7,102,933 B2  
(45) Date of Patent: Sep. 5, 2006

(54) COMBINED RECEIVER AND LATCH

(75) Inventor: Alessandro Minzoni, Morrisville, NC (US)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/966,776

(22) Filed: Oct. 15, 2004

(65) Prior Publication Data

US 2006/0083075 A1   Apr. 20, 2006

(51) Int. Cl.
  *G11C 7/00*   (2006.01)
(52) U.S. Cl. ............. 365/189.05; 365/203; 365/230.08
(58) Field of Classification Search ........... 365/189.01, 365/189.05, 189.07, 203, 204, 194, 210, 365/233
See application file for complete search history.

(56) References Cited

U.S. PATENT DOCUMENTS 5,825,713 A * 10/1998 Lee ........................ 365/230.05
6,490,224 B1 * 12/2002 Manning ..................... 365/233
6,510,095 B1   1/2003 Matsuzaki et al.
6,522,172 B1   2/2003 Keeth et al.
6,738,295 B1 * 5/2004 Kim ....................... 365/189.05
6,757,214 B1   6/2004 Kawaguchi et al.
6,909,658 B1 * 6/2005 Arimoto et al. ............ 365/222

\* cited by examiner

*Primary Examiner*—Gene N. Auduong  
(74) *Attorney, Agent, or Firm*—Dicke, Billig & Czaja, PLLC

(57) ABSTRACT

A combined receiver and latch circuit is configured to receive an external clock signal, an external reference voltage and an external command signal. The circuit includes first and second nodes, first and second control gates, and an output circuit. The first and second nodes are each configured to be precharged under the control of the clock signal. The first control gate is configured to receive the reference voltage. The second control gate configured to receive the command signal. The output circuit is coupled to the first and second nodes. The first and second nodes are alternatively discharged by the first and second control gates in response to the reference voltage and the command signal. The output circuit is configured to be latched upon the alternative discharge of the first and second node.

20 Claims, 3 Drawing Sheets

COMBINED RECEIVER AND LATCH

BACKGROUND

The present invention relates to a circuits for receiving clock signals and for latching command signals, and more particularly to a circuit configured to function as a receiver and a latch at the same time.

High speed electronic systems often have critical timing requirements. In semiconductor memory devices, such as DRAM, SDRAM, DDR-SDRAM and the like, external clock and command signals are received by receivers within the memory device. These internal receivers then generate corresponding internal clock and command signals that are synchronized appropriately. In many applications, the internally generated clock signals have propagation delays that must be matched in the internally generated command signals in order to maintain proper synchronization.

For these and other reasons the need exits for the present invention.

SUMMARY

The present invention is a combined receiver and latch circuit. The circuit is configured to receive an external clock signal, an external reference voltage and an external command signal. The circuit includes first and second nodes, first and second control gates, and an output circuit. The first and second nodes are each configured to be precharged under the control of the clock signal. The first control gate is configured to receive the reference voltage. The second control gate configured to receive the command signal. The output circuit is coupled to the first and second nodes. The first and second nodes are alternatively discharged by the first and second control gates in response to the reference voltage and the command signal. The output circuit is configured to be latched upon the alternative discharge of the first and second node.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
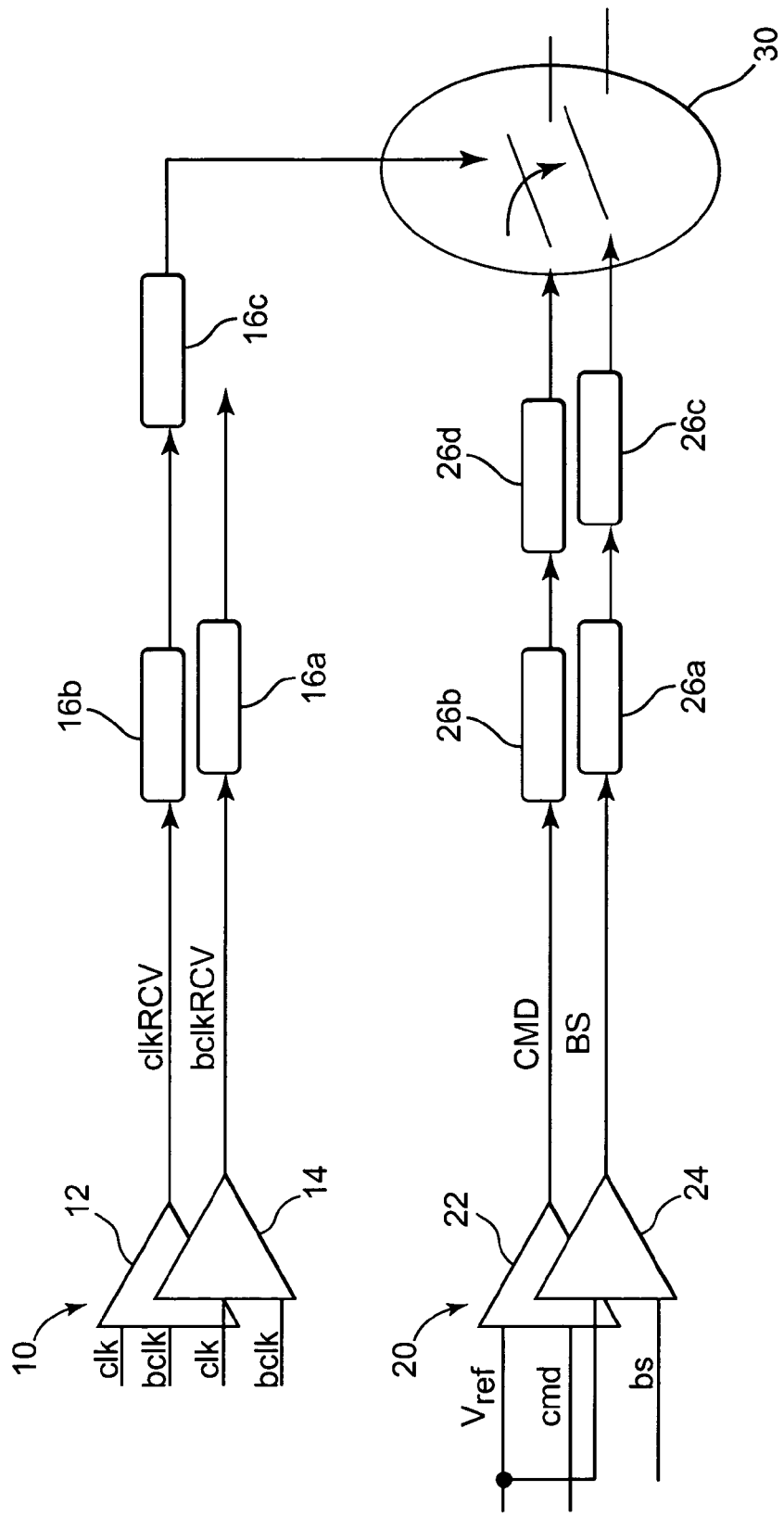
FIG. 1 illustrates a block diagram of receiver and latch circuits.

FIG. 1 generally illustrates a conventional receiver structure, which may, for example, be associated with a semiconductor memory device. The receiver includes clock receivers 10 and command receivers 20. Clock receivers 10 further include first clock receiver 12, which is configured to receive external clock signals clk and bclk and to produce internal receiver clock signal clkRCV. Similarly, clock receivers 10 further include second clock receiver 14, which is configured to receive external clock signals clk and bclk and to produce internal complementary receiver clock signal bclkRCV. These internal receiver clock signals clkRCV and bclkRCV are used within the semiconductor memory device.

Command receivers 20 further include first command receiver 22, which is configured to receive external reference voltage $V_{ref}$ and external command signals cmd and to produce internal receiver command signal CMD. Similarly, command receivers 20 further include second command receiver 22, which is configured to receive external the reference voltage $V_{ref}$ and external been-selected signals bs and to produce internal receiver command signal BS. Single output lines CMD and BS are illustrated for receivers 22 and 24, but one skilled in the art will understand that several different command and been-selected signals may be received via receivers 22 and 24, and/or over similar such receivers.

Once generated by receivers 12 and 14, clock signals clkRCV and bclkRCV are affected by several components or circuits that will impact signal propagation. For example, circuit elements 16a and 16b may attempt to restore the duty-cycle of the external clk and bclk signals. Also, circuit elements 16c may be a pulse generator for a clock hold operation. As a result, in order to maintain proper synchronization between the clock signals clkRCV and bclkRCV and the command and been selected signals CMD and BS, any delays in the signal propagation of the clock signals clkRCV and bclkRCV must be mimicked in the CMD and BS signals. Circuit elements 26a, 26b, 26c and 26d may be buffer or related elements for mimicking the delay caused by such circuit elements as 16a and 16b.

In addition to the propagation delays, synchronization differences between clock receivers 10 and command receivers 20 may occur for other reasons as well. For example, clock signals clkRCV and bclkRCV are typically differential-type signals, while CMD and BS signals tend to be signals based on a comparison of a steady signal to a differential signal. The relative distances between the various circuit elements along the path of clock receivers 10 and command receivers 20 may differ. Finally, there will likely be different load conditions for the clock signals clkRCV and bclkRCV along clock receivers 10 than there are for the CMD and BS signals along command receivers 20. Consequently, circuit elements 26a through 26d may need to be configured to adequately delay the CMD and BS signals along the path of command receivers 20 to assure proper synchronization between the clock signals clkRCV and bclkRCV and the command and been-selected signals CMD and BS when they are combined at circuit 30.

Figure 2:
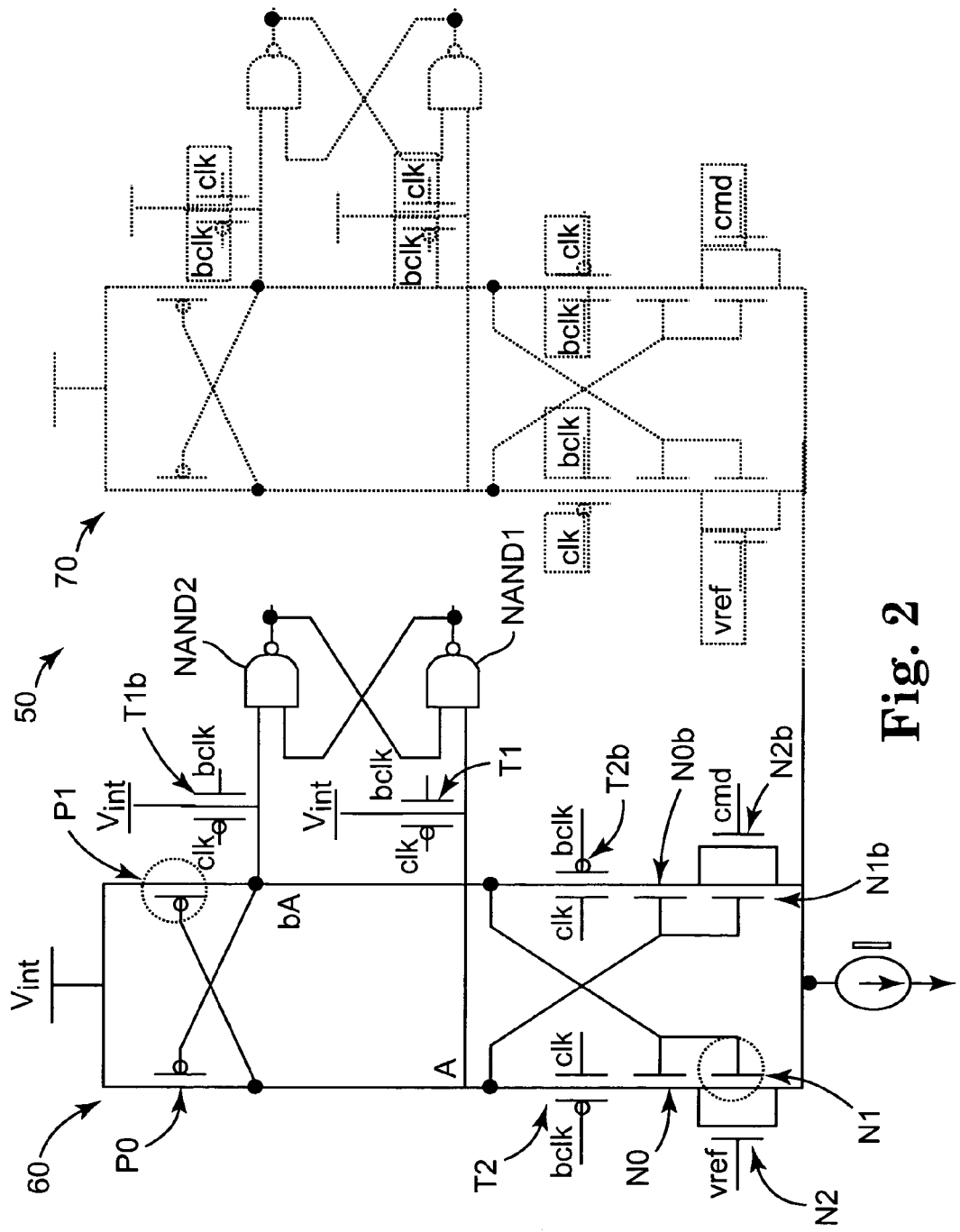
FIG. 2 illustrates one embodiment of a combined receiver and latch circuit in accordance with the present invention.

FIG. 2 illustrates one embodiment of combined receiver 50 in accordance with the present invention. Combined receiver 50 is a combined receiver and latch such that external clock and command signals may be received and latched at the same time, thereby avoiding the need to mimic delay from the clock receiver into the latch receiver. This can create good set-up and hold time and fast propagation.

In one embodiment, combined receiver 50 includes first receiver/latch circuit 60 and second receiver/latch circuit 70. First receiver/latch circuit 60 includes first, second, third and fourth transfer gates T1, T1b, T2, and T2b. Each of the transfer gates T1, T1b, T2, and T2b are NFET and PFET parallel-connected transistors with a common drain and common source. In one embodiment, first transfer gate T1 includes two transistors, a PMOS transistor and an NMOS transistor. Similarly, each of second, third and fourth transfer gates T1b, T2, and T2b include two transistors, a PMOS transistor and an NMOS transistor. Each transistor has a control terminal and first and second conductive terminals. External clock signals clk and bclk are coupled to the control terminal of each of transfer gates T1, T1b, T2, and T2b. In the case of first and second transfer gates T1 and T1b, external clock signal clk is coupled to the control terminal of the PMOS transistors and external clock signal bclk is coupled to the control terminal of the NMOS transistors. In the case of third and fourth transfer gates T2 and T2b, external clock signal clk is coupled to the control terminal of the NMOS transistors and external clock signal bclk is coupled to the control terminal of the PMOS transistors.

The first conductive terminal of first transfer gate T1 is coupled to node A. The first conductive terminal of second transfer gate T1b is coupled to node bA. A precharge voltage $V_{int}$ is coupled to second conductive terminals of both first and second transfer gates T1 and T1b. The first conductive terminal of third transfer gate T2 is coupled to node A. The first conductive terminal of fourth transfer gate T2b is coupled to node bA.

First receiver/latch circuit 60 also includes an output circuit comprising a flip flop, which includes NAND1 and NAND2. Both NAND1 and NAND2 NAND gates configured as conventional flip flops. The flip flop has two inputs, a first input coupled to node A and a second input coupled to node bA.

First receiver/latch circuit 60 also includes first and second latch gates P0 and P1. Both first and second latch gates P0 and P1 are PMOS gates having a control terminal and first and second conductive terminals. The control terminal of first latch gate P0 is coupled to node bA and the control terminal of second latch gate P1 is coupled to node A. The first conductive terminal of first latch gate P0 is coupled to node A and the first conductive terminal of second latch gate P1 is coupled to node bA. Both second conductive terminals of first and second latch gates P0 and P1 are coupled to precharge voltage $V_{int}$.

First receiver/latch circuit 60 further includes first, second, third and fourth path gates N0, N1, N0b and N1b. Each of path gates N0, N1, N0b and N1b are NMOS gates having a control terminal and first and second conductive terminals. First and second path gates N0 and N1 are connected in series, thereby forming a first discharge path, and third and fourth gates N0b and N1b are connected in series, thereby forming a second discharge path.

The control terminals of each of first and second path gates N0 and N1 are coupled to node bA. The control terminals of each of third and fourth path gates N0b and N1b are coupled to node A. The first conductive terminal of first path gate N0 is coupled to the second conductive terminal of third transfer gate T2. The second conductive terminal of first path gate N0 is coupled to the first conductive terminal of second path gate N1. The second conductive terminal of second path gate N1 is coupled to current source I. The first conductive terminal of third path gate N0b is coupled to the second conductive terminal of fourth transfer gate T2b. The second conductive terminal of third path gate N0b is coupled to the first conductive terminal of fourth path gate N1b. The second conductive terminal of fourth path gate N1b is coupled to current source I.

Finally, first receiver/latch circuit 60 includes first and second control gates N2 and N2b, each of which are NMOS transistors having a control terminal and first and second conductive terminals. First control gate N2 is connected in parallel with first and second path gates N0 and N1, and second control gate N2b is connected in parallel with third and fourth path gates N0b and N1b. First and second control gates N2 and N2b exert control over the first and second discharge paths in accordance with the present invention.

The first conductive terminal the first control gate N2 is coupled between the second conductive terminal of first path gate N0 and the first conductive terminal of second path gate N1. The second conductive terminal the first control gate N2 is coupled between the second conductive terminal of second path gate N1 and the current source I. The first conductive terminal the second control gate N2b is coupled between the second conductive terminal of third path gate N0b and the first conductive terminal of fourth path gate N1b. The second conductive terminal the second control gate N2b is coupled between the second conductive terminal of fourth path gate N1b and the current source I.

External reference voltage $V_{ref}$ is coupled to the control terminal of first control gate N2 and external command signal cmd is coupled to the control terminal of second control gate N2b. The relative magnitude of the external reference voltage $V_{ref}$ and command signal cmd controls latching of receiver/latch circuit 60. Since latching in receiver/latch circuit 60 is responsive to the external signals, it is evident that both receiving and latching occurs in one structure at the same time.

Figure 3:
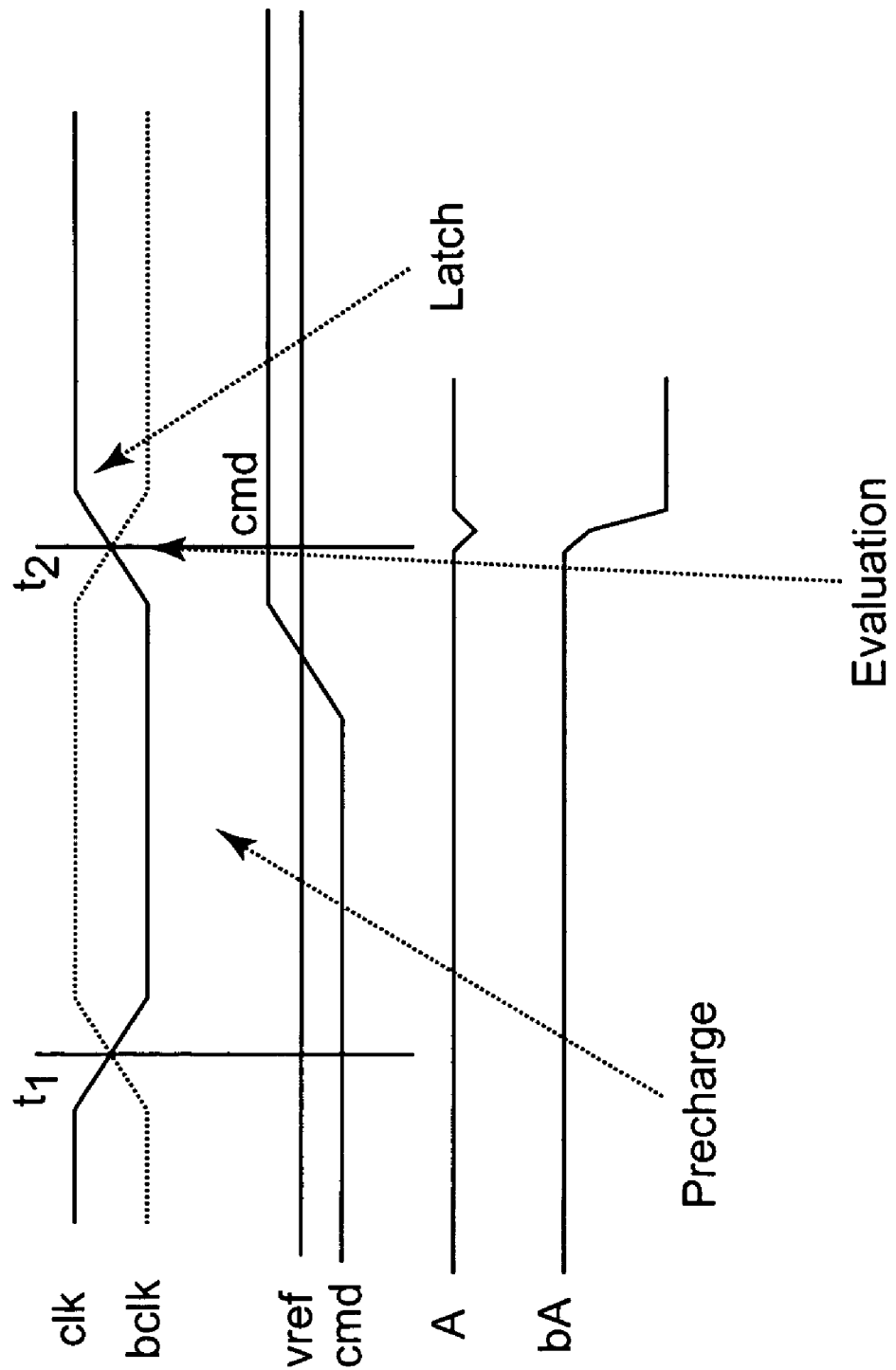
FIG. 3 illustrates timing signals for the circuit of FIG. 2.

Operation of receiver/latch circuit 60 is illustrated in combination with the signals illustrated in FIG. 3. Receiver/latch circuit 60 is in a precharge phase between time $t_1$ and time $t_2$, as illustrated in FIG. 3. During this phase, external clock clk is low and bclk is high. Under these conditions, first and second transfer gates T1 and T1b are turned on or closed. In this way, nodes A and bA are both precharged to the precharge voltage $V_{int}$. Because of the reversal of the application of external clock clk and bclk to the control terminals of the PMOS and NMOS transistors of third and fourth transfer gates T2 and T2b relative first and second transfer gates T1 and T1b, third and fourth transfer gates T2 and T2b are turned off or open during the precharge phase.

With nodes A and bA both precharged to $V_{int}$ during the precharge phase, first and second latch gates P0 and P1 are both turned off or open. Consequently, the open circuits isolate nodes A and bA such that they are both held high. Thus, both the first and second inputs of the flip flop are held high so that any value previously stored in the flip flop is retained and does not change.

Also with nodes A and bA both precharged to $V_{int}$, all of path gates N0, N1, N0b and N1b are turned on or closed. In the precharge phase, however, both the first and second control gates N2 and N2b will be in an undefined state that will depend on the relative values of $V_{ref}$ and cmd.

At time $t_2$, receiver/latch circuit 60 moves to an evaluation phase. During the evaluation phase, external clocks clk and bclk toggle such that bclk is transitioning high and clk is transitioning low. In this way, first and second transfer gates T1 and T1b are turned off or open, thereby cutting off the precharge voltage $V_{int}$ from nodes A and bA. Again, because of the reversal of the application of external clock clk and bclk to the control terminals of the PMOS and NMOS transistors of third and fourth transfer gates T2 and T2b relative first and second transfer gates T1 and T1b, third and fourth transfer gates T2 and T2b are turned on or closed during the evaluation phase.

Even though first and second transfer gates T1 and T1b are turned off cutting off $V_{int}$ from nodes A and bA, nodes A and bA remain precharged (from the precharge phase) during the evaluation phase. Thus, first and second latch gates P0 and P1 are both turned off or open, and all of path gates N0, N1, N0b and N1b are turned on or closed.

With third and fourth transfer gates T2 and T2b, and all of path gates N0, N1, N0b and N1b turned on, first and second discharge paths from nodes A and bA are open to the current source I. The first and second discharge paths to ground, however, are different for nodes A and bA. Rather than nodes A and bA being caused to discharge equally, first and second control gates N2 and N2b will influence the discharge, and specifically, the signals at the control terminals of these gates will so influence the discharge.

After time $t_2$, receiver/latch circuit 60 will latch in its latch phase. The relative magnitudes of $V_{ref}$ and cmd on the control terminals of first and second control gates N2 and N2b cause the latch by influencing the first discharge path between node A and ground and the second discharge path between node bA and ground, respectively. When, as illustrated in FIG. 3, the command signal cmd is higher than the reference signal Vref, second control gate N2b will be stronger than first control gate N2 thereby draining more current through that gate. This will cause node bA to discharge faster via the second discharge path than will node A via the first discharge path.

With node bA discharging faster than node A, first and second path gates N0 and N1 start to close off quicker, because node bA is coupled to its control terminal, than do third and fourth path gates N0b and N1b, with control gates coupled to node A. At the same time, with node bA discharging faster than node A, latch gate P0 will switch from off to on, because node bA is coupled to its control terminal. Turning on latch gate P0 will pull node A up to the precharge voltage $V_{int}$. With node A precharged to $V_{int}$, second latch gate P1 will remain off. Consequently, with node A pulled high and node bA drained low, the input to the flip flop are opposite thereby toggling the flip flop and latching receiver/latch circuit 60. The various precharge and discharge conditions of nodes A and bA are exaggerated and somewhat simplified in FIG. 3 to illustrate these conditions.

Due to the symmetry of receiver/latch circuit 60, it is evident that when the converse of that illustrated in FIG. 3 is true, that is, when the command signal cmd is lower than the reference signal Vref, first control gate N2 will be stronger than second control gate N2b thereby draining more current through that gate. This will cause node A to discharge faster via the first discharge path than will node bA via the second discharge path. Under these conditions, third and fourth path gates N0b and N1b start to close off quicker than do first and second path gates N0 and N1. At the same time, with node A discharging faster than node bA, latch gate P1 will switch from off to on. Turning on latch gate P1 will pull node bA up to the precharge voltage $V_{int}$. With node bA precharged to $V_{int}$, first latch gate P0 will remain off. Consequently, with node bA pulled high and node A drained low, the input to the flip flop are opposite thereby toggling the flip flop and latching receiver/latch circuit 60.

Thus, receiver/latch circuit 60 may be configured to latch whenever the command signal cmd is significantly different, either higher or lower, than the reference signal Vref, which is typically a steady state signal.

As is evident from examination of receiver/latch circuits 60 and 70, the circuits are highly analogous. The circuit components of circuits 60 and 70 are identical and external clock signals bclk and clk are reversed on the first through fourth transfer gates. In this way, receiver/latch circuit 60 is configured to be rising-edge sensitive while receiver/latch circuit 70 is configured to be falling-edge sensitive. In this way, receiver/latch circuit 60 is configured to be in the precharge phase when external clock signal clk is low and external clock signal bclk is high, and configured to latch as clk transitions high and bclk transitions low. Similarly, receiver/latch circuit 70 is configured to be in the precharge phase when external clock signal clk is high and external clock signal bclk is low, and configured to latch as clk transitions low and bclk transitions high.

Thus, both circuits 60 and 70 may be employed in applications sensitive to both rising and falling edges, such as DDR-DRAM applications, or receiver/latch circuit 60 may be employed for applications sensitive to rising edges, or receiver/latch circuit 70 may be employed for applications sensitive to falling edges. Use of just on circuit 60 or 70 or use of both circuits 60 and 70 may be made consistent with the present invention.

Combined receiver 50 is a combined receiver and latch such that external clock and command signals may be received and latched at the same time, thereby avoiding the need to mimic delay from the clock receiver into the latch receiver. This can create good set-up and hold time and fast propagation. As indicated external clocking signals and command signals discussed with respect to the above-embodiment are meant to be illustrative of any of the several external signals that are received into a system such as a semiconductor memory system in order to clock and latch that system. For example, one skilled in the art will be familiar with any of the several command signals that are received by semiconductor memory devices to latch data in and out of the device in coordination with clock signals.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A combined receiver and latch circuit in a semiconductor memory device configured to receive an external clock signal, an external reference voltage and an external command signal, the circuit comprising:

first and second nodes each configured to be selectively precharged to a precharge voltage under the control of the clock signal;

a first control gate configured to receive the reference voltage;

a second control gate configured to receive the command signal; and an output circuit coupled to the first and second nodes;
wherein the first and second nodes are alternatively discharged by the first and second control gates in response to the reference voltage and the command signal, and wherein the output circuit is configured to be latched upon the alternative discharge of the first and second node.

2. The combined circuit of claim 1, wherein the first control gate is configured to control a first discharge path via the reference voltage and the second control gate is configured to control a second discharge path via the command signal.

3. The combined circuit of claim 1 further including a first transfer gate configured to receive the clock signal and coupled to the first node such that the first transfer gate selectively couples the first node to a precharge voltage in response to transitions of the clock signal and further including a second transfer gate configured to receive the clock signal and coupled to the second node such that the second transfer gate selectively couples the second node to the precharge voltage in response to transitions of the clock signal.

4. The combined circuit of claim 2, wherein the output circuit is a flip flop having two NAND gates and including first and second inputs, wherein the first node is coupled to the first input of the output circuit and coupled to the first discharge path, wherein the second node is coupled to the second input of the output circuit and coupled to the second discharge path.

5. The combined circuit of claim 2 further including a third transfer gate in the first discharge path and configured to receive the clock signal such that the first discharge path is selectively opened in response to transitions of the clock signal and further including a fourth transfer gate in the second discharge path and configured to receive the clock signal such that the second discharge path is selectively opened in response to transitions of the clock signal.

6. The combined circuit of claim 5 further including first, second, third and fourth path gates, wherein the first and second path gates are connected in series between the first node and ground in the first discharge path, and wherein the third and fourth path gates are connected in series between the second node and ground in the second discharge path.

7. The combined circuit of claim 6, wherein the first control gate is connected in parallel to the first and second path gates and wherein the second control gate is connected in parallel to the third and fourth path gates.

8. The combined circuit of claim 6, wherein the first and second path gates are controlled by the voltage at the second node and wherein the third and fourth path gates are controlled by the voltage at the first node.

9. The combined circuit of claim 5, further configured to be responsive to the clock signal such that the output circuit is configured to be latched upon both rising-edge transitions of the clock signal and upon falling-edge transitions of the clock signal.

10. The combined circuit of claim 2, further including first and second latch gates, wherein the first latch gate is coupled between the precharge voltage and the first node and the first latch gate is controlled by the voltage at the second node, and wherein the second latch gate is coupled between the precharge voltage and the second node and the second latch gate is controlled by the voltage at the first node.

11. A combined circuit for receiving an clock signal, an reference voltage and an command signal, the circuit comprising:

a first control gate configured receive the reference voltage and to control a first discharge path;

a second control gate configured to receive the command signal and to control a second discharge path;

an output circuit with first and second inputs;

a first node coupled to the first input of the output circuit and coupled to the first discharge path;

a second node coupled to the second input of the output circuit and coupled to the second discharge path;

a first transfer gate configured to receive the clock signal and coupled to the first node such that the first transfer gate selectively couples the first node to a precharge voltage in response to transitions of the clock signal; and a second transfer gate configured to receive the clock signal and coupled to the second node such that the second transfer gate selectively couples the second node to the precharge voltage in response to transitions of the clock signal;

wherein the output circuit is latched when the first and second nodes are alternately discharged.

12. The combined circuit of claim 11, wherein the output circuit is a flip flop consisting of two NAND gates.

13. The combined circuit of claim 11 further including a third transfer gate in the first discharge path and configured to receive the clock signal such that the first discharge path is selectively opened in response to transitions of the clock signal and further including a fourth transfer gate in the second discharge path and configured to receive the clock signal such that the second discharge path is selectively opened in response to transitions of the clock signal.

14. The combined circuit of claim 13 further including first, second, third and fourth path gates, wherein the first and second path gates are connected in series between the first node and ground in the first discharge path, and wherein the third and fourth path gates are connected in series between the second node and ground in the second discharge path.

15. The combined circuit of claim 14, wherein the first control gate is connected in parallel to the first and second path gates and wherein the second control gate is connected in parallel to the third and fourth path gates.

16. The combined circuit of claim 14, wherein the first and second path gates are controlled by the voltage at the second node and wherein the third and fourth path gates are controlled by the voltage at the first node.

17. The combined circuit of claim 11, further including first and second latch gates, wherein the first latch gate is coupled between the precharge voltage and the first node and the first latch gate is controlled by the voltage at the second node, and wherein the second latch gate is coupled between the precharge voltage and the second node and the second latch gate is controlled by the voltage at the first node.

18. A method for both receiving and for latching at the same time an external clock signal, an external reference voltage and an external command signal, the method comprising:

precharging first and second node to a precharge voltage when the clock signal is in a first state;

receiving relative magnitudes of the reference voltage and of the command signal;

discharging the first node and holding the precharge voltage at the second node when the magnitude of the reference voltage is greater than the magnitude of the command signal;

discharging the second node and holding the precharge voltage at the first node when the magnitude of the command signal is greater than the magnitude of the reference voltage; and toggling an output circuit when the voltage at one of the first and second nodes is discharged and the voltage and the other of the first and second nodes is the precharge voltage.

19. The method of claim 18 applied to a receiver and latch circuit in a semiconductor memory device that is configured to receive the external clock signal, the external reference voltage and the external command signal.

20. The method of claim 18, wherein a first control gate is configured receive the reference voltage and to control discharging the first node, wherein a second control gate is configured to receive the command signal and to control discharging the second, wherein a first transfer gate is configured to receive the clock signal and coupled to the first node such that the first transfer gate selectively precharges the first node, and wherein a second transfer gate is configured to receive the clock signal and coupled to the second node such that the second transfer gate selectively precharges the second node.

* * * * *